United States Patent
Lee et al.

(10) Patent No.: US 11,557,354 B2
(45) Date of Patent: Jan. 17, 2023

(54) FLASH MEMORY AND FLASH MEMORY CELL THEREOF

(71) Applicant: MACRONIX International Co., Ltd., Hsinchu (TW)

(72) Inventors: Feng-Min Lee, Hsinchu (TW); Po-Hao Tseng, Taichung (TW); Yu-Hsuan Lin, Taichung (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 1 day.

(21) Appl. No.: 17/166,484

(22) Filed: Feb. 3, 2021

(65) Prior Publication Data
US 2022/0246218 A1    Aug. 4, 2022

(51) Int. Cl.
| | |
|---|---|
| G11C 16/30 | (2006.01) |
| H01L 29/788 | (2006.01) |
| G11C 16/24 | (2006.01) |
| G11C 16/08 | (2006.01) |
| G11C 16/16 | (2006.01) |
| H01L 29/792 | (2006.01) |
| H01L 29/423 | (2006.01) |
| H01L 27/11573 | (2017.01) |
| H01L 27/11524 | (2017.01) |
| H01L 27/11529 | (2017.01) |
| G11C 11/56 | (2006.01) |
| H01L 27/1157 | (2017.01) |

(52) U.S. Cl.
CPC .......... *G11C 16/30* (2013.01); *G11C 11/5635* (2013.01); *G11C 11/5671* (2013.01); *G11C 16/08* (2013.01); *G11C 16/16* (2013.01); *G11C 16/24* (2013.01); *H01L 27/1157* (2013.01); *H01L 27/11524* (2013.01); *H01L 27/11529* (2013.01); *H01L 27/11573* (2013.01); *H01L 29/42392* (2013.01); *H01L 29/7885* (2013.01); *H01L 29/792* (2013.01)

(58) Field of Classification Search
CPC .................................. G11C 7/10; G11C 16/30
USPC ...................................................... 365/185.23
See application file for complete search history.

(56) References Cited

U.S. PATENT DOCUMENTS

| | | | |
|---|---|---|---|
| 6,285,599 B1 * | 9/2001 | Shimada | G11C 16/16 365/185.29 |
| 7,173,851 B1 * | 2/2007 | Callahan | G11C 17/18 365/185.21 |
| 11,183,242 B1 * | 11/2021 | Vimercati | G11C 16/0425 |

(Continued)

OTHER PUBLICATIONS

Y.Cheng et al., "Ultra-High Endurance and Low IOFF Selector based on AsSeGe Chalcogenides fo rWide Memory Window 3D Stackable Crosspoint Memory,"2018 IEEE International Electron Devices Meeting(IEDM), Dec. 2018,pp. 1-4.*

(Continued)

*Primary Examiner* — Muna A Techane
(74) *Attorney, Agent, or Firm* — J.C. Patents (57) ABSTRACT

A flash memory cell includes a rectifying device and a transistor. The rectifying device has an input end coupled to a bit line. The transistor has a charge storage structure. The transistor has a first end coupled to an output end of the rectifying device, the transistor has a second end coupled to a source line, and a control end of the transistor is coupled to a word line.

13 Claims, 5 Drawing Sheets

(56) References Cited

U.S. PATENT DOCUMENTS

2014/0191184 A1  7/2014  Yamauchi et al.
2019/0051340 A1* 2/2019  Liu ........................ G11C 11/16

OTHER PUBLICATIONS

H. Y. Cheng, et al., "Ultra-High Endurance and Low IOFF Selector based on AsSeGe Chalcogenides for Wide Memory Window 3D Stackable Crosspoint Memory," 2018 IEEE International Electron Devices Meeting (IEDM), Dec. 2018, pp. 1-4.
"Office Action of Taiwan Counterpart Application", dated Aug. 6, 2021, p. 1-p. 6.

* cited by examiner

FLASH MEMORY AND FLASH MEMORY CELL THEREOF

BACKGROUND

Technical Field

The disclosure relates to a flash memory and a flash memory cell thereof, and particularly relates to a flash memory cell having a two-terminal access mechanism and a flash memory constructed therefrom.

Description of Related Art

In the related technical field, a NOR flash memory constructs a single flash memory cell with a transistor (1T). This type of flash memory cell cannot provide an over-erasing operation for setting the threshold voltage of the flash memory cell to a negative voltage. Under such a premise, the NOR flash memory in the related technical field needs to provide a higher word line voltage to activate the transistor and read the stored data during a reading operation. For this reason, in the related technology, the reading speed of the flash memory cell is limited, and higher power consumption is required. Correspondingly, when a programming operation is performed, the threshold voltage of the flash memory cell needs to be raised to a relatively high voltage value, so a higher programming voltage is also required, which also results in high power consumption. In addition, there are negative effects on current leakage and data reliability.

SUMMARY

The disclosure provides a flash memory, a flash memory cell and an operation method thereof, which reduce leakage from a non-selected memory cell, and support functions of over-erasing and reading of 0 word line voltage.

The flash memory cell according to the disclosure includes a rectifying device and a transistor. The rectifying device has an input end coupled to a bit line. The transistor has a charge storage structure. The transistor has a first end coupled to an output end of the rectifying device, the transistor has a second end coupled to a source line, and a control end of the transistor is coupled to a word line.

The flash memory according to the disclosure includes a plurality of flash memory cells, a plurality of bit lines, a plurality of word lines, and a plurality of source lines. The flash memory cells are arranged in a memory cell array, and the memory cell array has a plurality of memory cell columns and a plurality of memory cell rows. The bit lines are respectively coupled to the memory cell rows. The word lines are respectively coupled to the memory cell rows. The source lines are respectively coupled to the memory cell columns. Each of the flash memory cells includes a rectifying device and a transistor. The rectifying device has an input end coupled to the corresponding bit line. The transistor has a charge storage structure. The transistor has a first end coupled to an output end of the rectifying device. The transistor has a second end coupled to the corresponding source line. A control end of the transistor is coupled to the corresponding word line.

The control method for the flash memory according to the disclosure includes: providing a rectifying device to be coupled between a corresponding bit line and a transistor having a charge storage structure; in a program operation, enabling a selected word line corresponding to a selected memory cell to receive a first voltage; enabling a selected bit line corresponding to the selected memory cell to receive a second voltage; and enabling a selected source line corresponding to the selected memory cell to receive a third voltage, wherein the first voltage is greater than the second voltage, and the second voltage is greater than the third voltage.

Based on the above, the flash memory cell according to the disclosure has the rectifying device to be coupled between the transistor and the bit line, and has a two-terminal access architecture. The two-terminal access architecture prevents leakage from a non-selected flash memory cell, and provides an over-erasing operation and a function of reading 0 word line voltage. In addition, the flash memory constructed with the flash memory cell of the disclosure has an improved reading speed, and the circuit layout area required by the memory cell array is effectively reduced.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
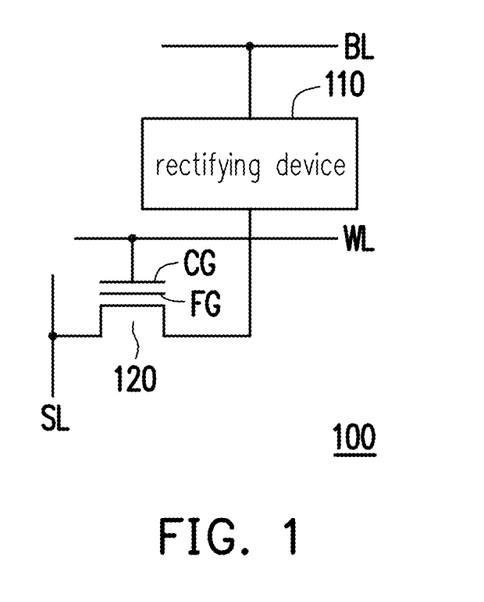
FIG. 1 is a schematic diagram of a flash memory cell according to an embodiment of the disclosure.

Referring to FIG. 1, FIG. 1 is a schematic diagram of a flash memory cell according to an embodiment of the disclosure. The flash memory cell 100 includes a rectifying device 110 and a transistor 120. The rectifying device 110 has an input end to be coupled to a bit line BL. The transistor 120 has a charge storage structure. The transistor 120 has a first end coupled to an output end of the rectifying device 110; the transistor 120 has a second end coupled to a source line SL; and a control end of the transistor 120 is coupled to a word line WL.

In this embodiment, the transistor 120 has a floating gate FG, and the floating gate FG is configured to form the charge storage structure. The transistor 120 also has a control gate CG. The control gate CG of the transistor 120 is coupled to the word line WL.

In this embodiment, the rectifying device 110 is turned on when the voltage on the input end is greater than a threshold value, and causes the voltage on the output end to be equal to the voltage on the input end minus the threshold value. In contrast, when the voltage on the input end of the rectifying device 110 is not greater than the threshold value, the rectifying device 110 is equivalently disconnected. At this time, the output end of the rectifying device 110 may be in a floating state.

According to the above, when the flash memory cell 100 is set as a non-selected flash memory cell in a programming operation, the voltage on the bit line BL and/or the voltage on the word line WL may be pulled down, so as to effectively inhibit the flash memory cell 100, thereby reducing the possibility of leakage.

Figure 2:
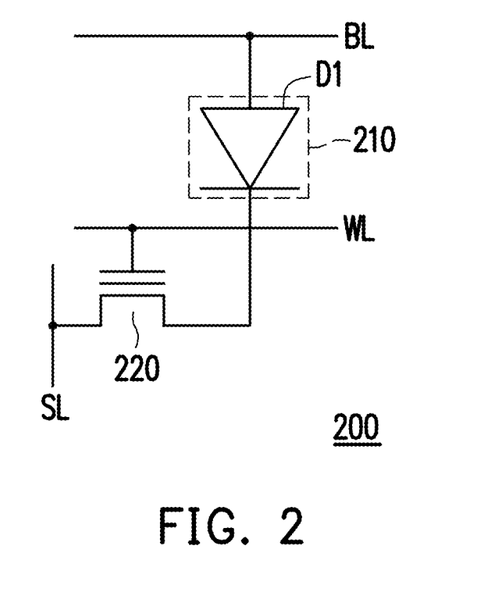
FIG. 2 is a schematic diagram of a flash memory cell according to another embodiment of the disclosure.

Hereinafter, referring to FIG. 2, FIG. 2 is a schematic diagram of a flash memory cell according to another embodiment of the disclosure. The flash memory cell 200 includes a rectifying device 210 and a transistor 220. The rectifying device 210 has an input end to be coupled to a bit line BL. The transistor 220 has a charge storage structure. The transistor 220 has a first end coupled to an output end of the rectifying device 210; the transistor 220 has a second end coupled to a source line SL; and a control end of the transistor 220 is coupled to a word line WL.

In this embodiment, the rectifying device 210 is a diode D1. An anode of the diode D1 may be the input end of the rectifying device 210, and a cathode of the diode D1 may be the output end of the rectifying device 210. The diode D1 may be turned on when the voltage on the bit line is greater than a turn-on voltage thereof. In contrast, when the voltage on the bit line is not greater than the turn-on voltage, the diode D1 may be turned off.

Figure 3:
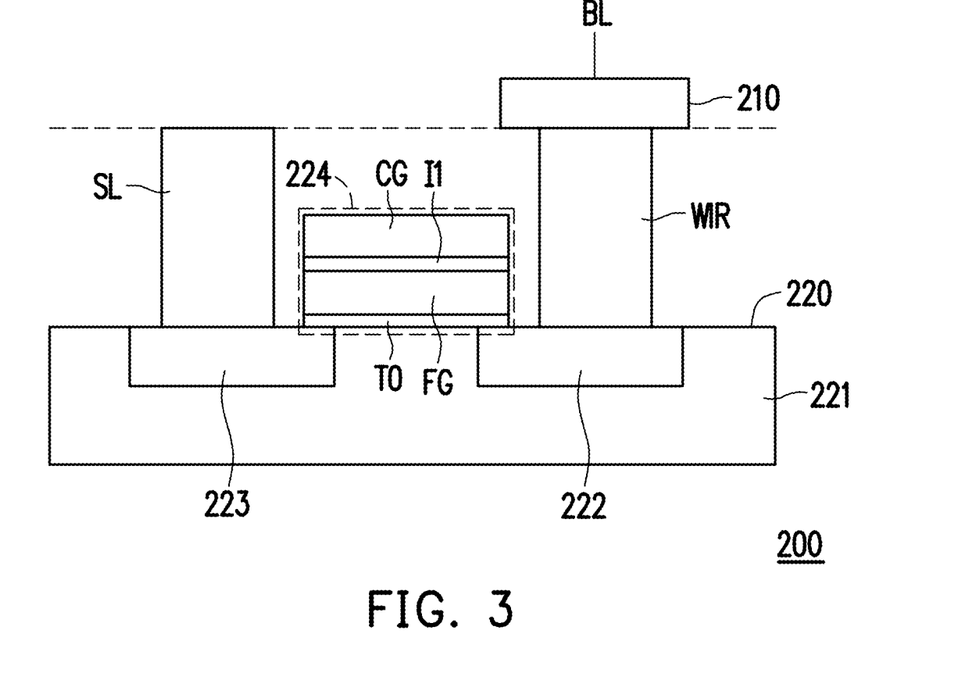
FIG. 3 is a schematic cross-sectional view of the structure of the flash memory cell in the embodiment of FIG. 2 of the disclosure.

Hereinafter, referring to FIG. 2 and FIG. 3, FIG. 3 is a schematic cross-sectional view of the structure of the flash memory cell in the embodiment of FIG. 2 of the disclosure. In FIG. 3, the transistor 220 includes a substrate 221, doped regions 222 and 223, and a gate structure 224. The doped regions 222 and 223 are disposed in the substrate 221 and have a different conductivity type from the substrate 221. The gate structure 224 includes a control gate CG, an insulating layer I1, a floating gate FG, and a tunnel oxide layer TO. The tunnel oxide layer TO, the floating gate FG, the insulating layer I1, and the control gate CG sequentially cover between the doped region 222 and the doped region 223 on the substrate 221.

In this embodiment, the doped region 222 is coupled to the output end of the rectifying device 210 through a conductive structure WIR. The input end of the rectifying device 210 is coupled to the bit line BL. The rectifying device 210 may be a PN junction diode and is formed on the upper surface of the substrate 221. A P pole of the diode D1 is coupled to the bit line BL, and an N pole is coupled to the conductive structure WIR. The doped region 223 is coupled to the source line SL. In this embodiment, the source line SL and the conductive structure WIR may be formed by metal structures of the same material.

In addition, the substrate 221 in this embodiment may be a P-type substrate, and the doped regions 222 and 223 may be N-type enhanced doped regions.

It should be noted that in other embodiments, the rectifying device 210 may be replaced by a selector. The selector may be formed by back-end of line (BEOL). Please refer to FIG. 4A and FIG. 4B for details of the selector.

Figure 4A:
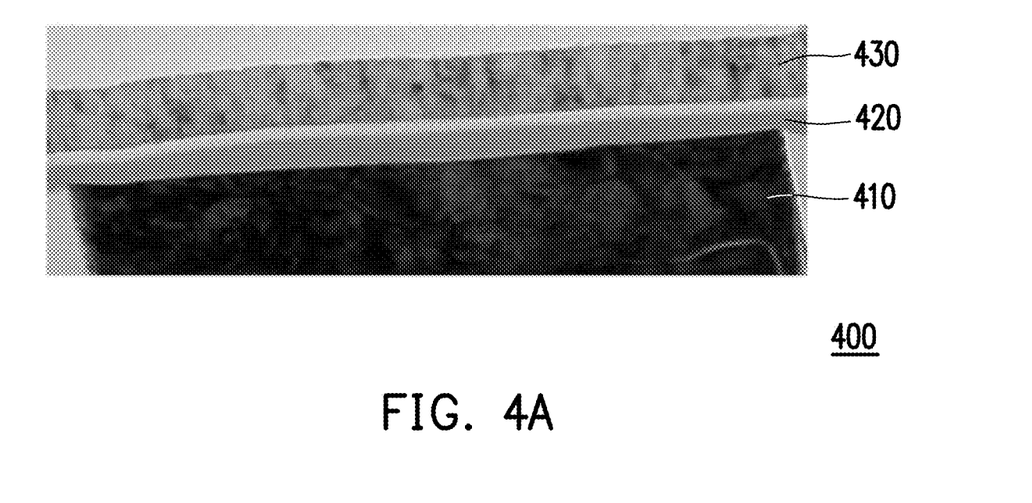
FIG. 4A and FIG. 4B respectively show the structure and electrical characteristics of a selector configured to construct a rectifying device in an embodiment of the disclosure.
Figure 4B:
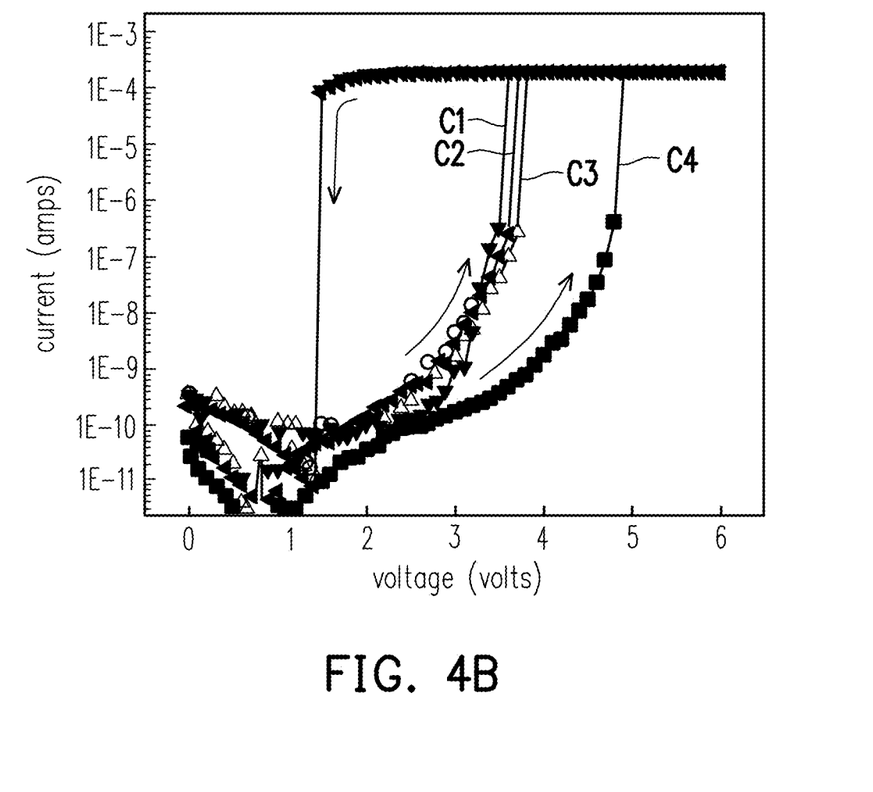

FIG. 4A and FIG. 4B respectively show the structure and electrical characteristics of a selector configured to construct a rectifying device in an embodiment of the disclosure. In FIG. 4A, the selector 400 may be formed by stacking three structures 410 to 430 of different materials. The structure 410 may be a tungsten-plug, and the structure 420 may have a compound material composed of arsenic (As), selenium (Se), and germanium (Ge). The structure 430 may be a titanium nitride (TiN) structure.

In FIG. 4B, the curves C1 to C4 respectively represent the current-voltage (I-V) relationship diagrams of the selector 400 under different numbers of use cycles. Specifically, the curves C1 to C4 respectively correspond to multiple use cycles from small to large. Take the curve C4 as an example, when the voltage received by the selector 400 increases gradually and increases to approximately more than 4 volts, the selector 400 performs like a turned-on diode and provides a rapidly increasing output current. When the voltage received by the selector 400 increases to approximately equal to 5 volts (or more), the output current generated by the selector 400 may be limited to approximately 10 amps. It should be noted that when the voltage received by the selector 400 drops, if the voltage received by the selector 400 is more than 2 volts, the selector 400 maintains an output current of approximately 10" to 10 amps. When the voltage received by the selector 400 drops below 2 volts, the selector 400 drops rapidly and performs like a turned-off diode.

Nevertheless, the structure of the selector 400 shown in FIG. 4A is merely an example for illustration, and is not intended to limit the scope of the disclosure. A selector 400 of any architecture that is well known to those with ordinary knowledge in the art and can be implemented by BEOL is applicable to the disclosure.

Figure 5:
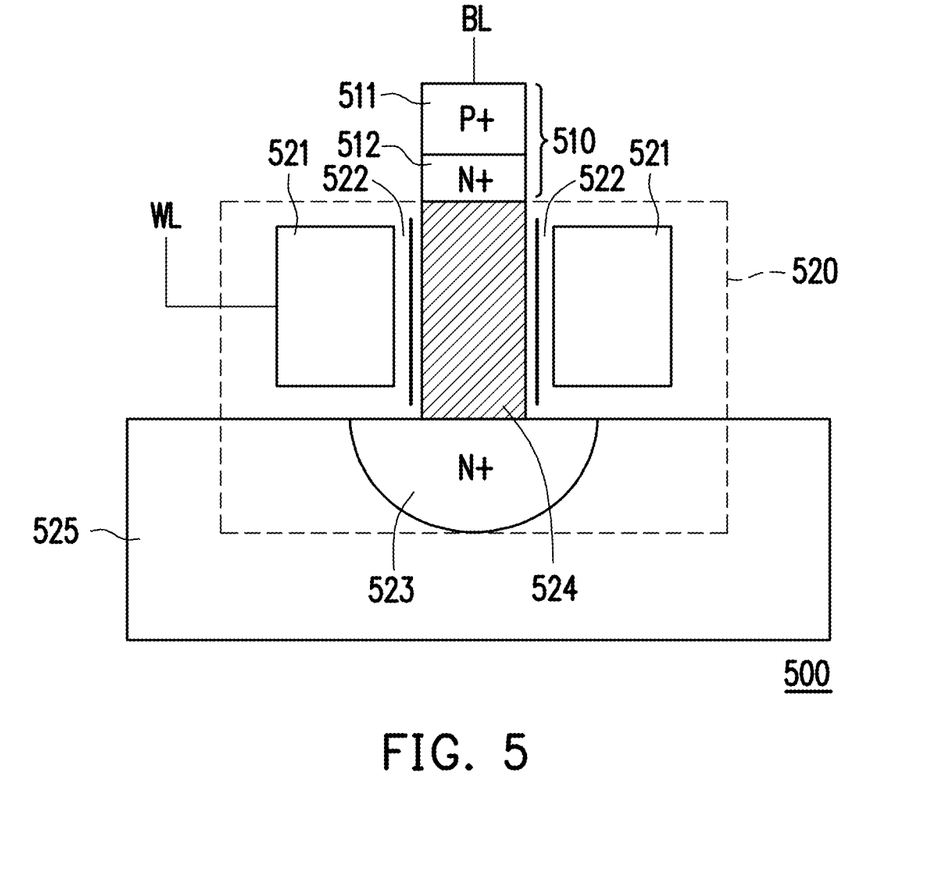
FIG. 5 is a schematic cross-sectional view of the structure of a flash memory cell according to another embodiment of the disclosure.

Hereinafter, referring to FIG. 5, FIG. 5 is a schematic cross-sectional view of the structure of a flash memory cell according to another embodiment of the disclosure. The flash memory cell 500 includes a rectifying device 510 and a transistor 520. The rectifying device 510 is formed by stacking a P-type enhanced (P+) doped region 511 and an N-type enhanced (N+) doped region 512. The P+ doped region 511 is coupled to a bit line BL, and the N+ doped region 512 is coupled to the transistor 520. The transistor 520 includes a substrate 525, a doped region 523, a polysilicon structure 524, a memory gate (MG) 521, and a silicon oxide-silicon nitride-silicon oxide (ONO) structure 522.

In this embodiment, the transistor 520 is a gate-all-around (GAA) transistor. The doped region 523 is disposed in the substrate 525 and has a different conductivity polarity from the substrate 525. The polysilicon structure 524 may be a columnar body and is disposed on the doped region 523 to form a vertical structure. The memory gate 521 surrounds the polysilicon structure 522 and is coupled to a word line WL. The ONO structure 522 is disposed between the memory gate 521 and the polysilicon structure 524, wherein the ONO structure 522 is configured as a charge storage structure.

In addition, the transistor 520 may share the doped region 512 with the rectifying device 510. The doped region 512 may serve as a cathode of the rectifying device 510, and serve as a source of the transistor 520 at the same time.

In this embodiment, the conductivity type of the substrate 525 may be P-type, and the doped region 523 may be an N-type enhanced (N+) doped region.

Figure 6:
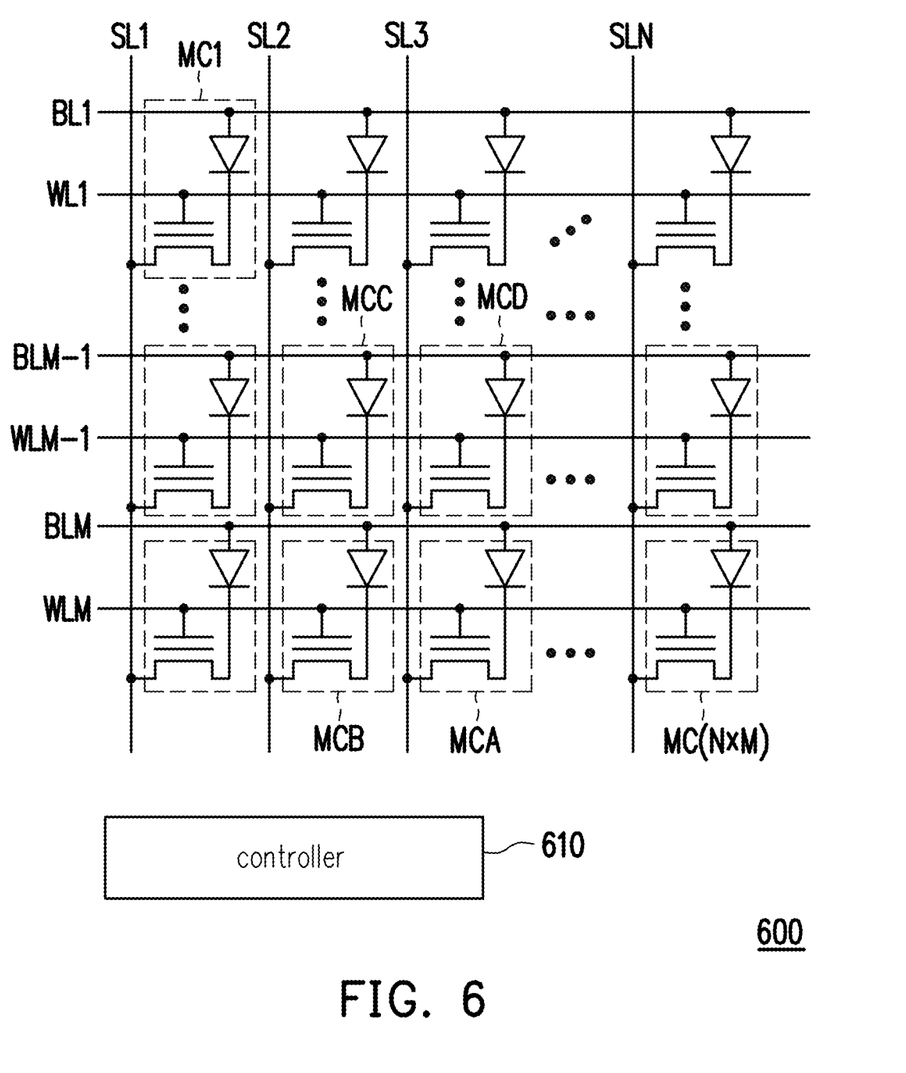
FIG. 6 is a schematic diagram of a flash memory according to an embodiment of the disclosure.

Hereinafter, referring to FIG. 6, FIG. 6 is a schematic diagram of a flash memory according to an embodiment of the disclosure. The flash memory 600 includes a plurality of flash memory cells MC1 to MC(N*M), a plurality of bit lines BL1 to BLM, a plurality of word lines WL1 to WLM, and a plurality of source lines SL1 to SLN. Wherein, each of the flash memory cells MC1 to MC(N*M) can be implemented by any one of the flash memory cells 100, 200 and 500 mentioned in the embodiments above, and the diodes in the figure is a rectifying device. The flash memory cells MC1 to MC(N*M) are arranged in a memory cell array. The memory cell array has a plurality of memory cell columns and a plurality of memory cell rows. The bit lines BL1 to BLM are respectively coupled to the memory cell rows, the word lines WL1 to WLM are respectively coupled to the memory cell rows, and the source lines SL1 to SLN are respectively coupled to the memory cell columns. The flash memory cells MC1 to MC(N*M) may be implemented using any of the flash memory cells in the foregoing embodiments, and are not particularly limited.

In terms of layout, the word lines WL1 to WLM and the bit lines BL1 to BLM may extend in the same first direction, and the source lines SL1 to SLN may extend in a second direction different from the first direction. The first direction may be orthogonal to the second direction.

In this embodiment, the flash memory 600 also includes a controller 610. The controller 610 is coupled to the flash memory cells MC1 to MC(N*M), and through the word lines WL1 to WLM, the bit lines BL1 to BLM, and the source lines SL1 to SLN, provides a voltage to the flash memory cells MC1 to MC(N*M), so as to perform a programming, erasing or reading operation on each of the flash memory cells MC1 to MC(N*M). The controller 610 is configured to perform a control method according to an embodiment of present disclosure. The control method may be used to program, erase or read each of the flash memory cells MC1 to MC(N*M).

In detail, in the programming operation, the flash memory cell MCA is the selected memory cell, and the flash memory cells MCB to MCD are the non-selected memory cells, for example. The controller 610 may set so that the word line WLM corresponding to the flash memory cell MCA is 8 volts; the bit line BLM is −8 volts; and the source line SL3 is −8 volts, and the flash memory cell MCA performs the programming operation by FN tunneling. At the same time, the controller 610 may set so that the source line SL2 corresponding to the flash memory cell MCB is 0 volt, and the word line WLM-1 and the bit line BLM-1 corresponding to the flash memory cells MCC and MCD are both 0 volt. In this way, the non-selected flash memory cells MCB to MCD are effectively inhibited without performing the programming operation.

It should be noted that in this embodiment, the flash memory cells MCA to MCD are disposed in the same well area (for example, P-type well area) in an integrated circuit. In the programming operation, the well area receives a bias voltage of −8 volts, for example.

If the programming operation is performed by channel hot electron injection, the controller 610 may set so that the word line WLM corresponding to the flash memory cell MCA is 10 volts; the bit line BLM is 5 volts; and the source line SL3 is 0 volt. At the same time, the controller 610 sets that the source line SL2 corresponding to the flash memory cell MCB is 5 volts, and the word line WLM-1 and the bit line BLM-1 corresponding to the flash memory cells MCC and MCD are both 0 volt. The well area receives a bias voltage of 0 volt, for example. In this way, the flash memory cell MCA is effectively programmed, and the flash memory cells MCB to MCD are effectively inhibited.

In the erasing operation, the controller 610 may set so that the bit lines BLM and BLM-1, the word lines WLM and WLM-1, and the source lines SL2 and SL3 are all 0 volt. The controller 610 also provides an erasing voltage (for example, 16 volts) to the well area to perform a block erasing operation for the flash memory cells MCA to MCD by FN tunneling.

In the reading operation, the controller 610 may set so that the word line WLM corresponding to the selected flash memory cell MCA is 0 volt; the bit line BLM is 1.2 volts; and the source line SL3 is 0 volt. At the same time, the controller 610 may set so that the source line SL2 corresponding to the flash memory cell MCB is 1.2 volts, and the word line WLM-1 and the bit line BLM-1 corresponding to the flash memory cells MCC and MCD are both 0 volt. In this way, the data of the flash memory cell MCA is read, and the flash memory cells MCB to MCD are inhibited.

In the reading operation, the well area shared by the flash memory cells MCA to MCD receives a bias voltage of 0 volt.

It should be noted that in the architecture of this embodiment, each of the flash memory cells MC1 to MC(N*M) is allowed to be over-erased. That is, the threshold voltage of the erased flash memory cell is a negative voltage value. Under such conditions, when the reading operation is performed, according to the embodiments of the disclosure, the voltage value of the bias voltage applied to the flash memory cell can be reduced to reduce the required power consumption. Moreover, under the premise of a low-voltage operation, current leakage that may occur in the flash memory device 600 of the embodiments of the disclosure can be effectively reduced.

It should be noted that the values of the voltages applied to the word lines, the bit lines, the source lines, and the well area in the foregoing embodiments are merely examples for illustration, and are not intended to limit the scope of the disclosure. In actual use, the values of the voltages applied to the word lines, the bit lines, the source lines, and the well area may be set according to various factors such as the process parameters of the integrated circuit, the voltage value of the operating power supply, etc., and are not particularly limited.

In addition, the controller 610 may be constructed using any form of digital circuit. In actual use, the controller 610 may coordinate with an analog voltage generator to provide various voltages corresponding to the programming operation, erasing operation or reading operation to the flash memory cell at an appropriate time. Here, how to control to provide various voltages corresponding to the programming operation, erasing operation or reading operation to the flash memory cell is well known to those with ordinary knowledge in the art, and therefore will not be repeated hereinafter.

In summary, in the flash memory cell according to the disclosure, a rectifying device is disposed between the transistor and the bit line, and the flash memory cell can provide a two-terminal access mechanism. In this way, the flash memory cell can perform an over-erasing operation, and the threshold voltage can be a negative voltage value. Under such conditions, the bias voltage required for the access operation of the flash memory cell is reduced, which effectively reduces power consumption and prevents possible current leakage. In addition, the reading speed of the flash memory is also improved.

What is claimed is:
1. A flash memory, comprising:
a plurality of flash memory cells arranged in a memory cell array, wherein the memory cell array has a plurality of memory cell columns and a plurality of memory cell rows;
a plurality of bit lines respectively coupled to the plurality of memory cell rows;
a plurality of word lines respectively coupled to the plurality of memory cell rows; and
a plurality of source lines respectively coupled to the plurality of memory cell columns,
wherein each of the flash memory cells comprises:

a rectifying device having an input end coupled to the corresponding bit line; and a transistor having a charge storage structure, wherein the transistor has a first end coupled to an output end of the rectifying device, the transistor has a second end coupled to the corresponding source line, and a control end of the transistor is coupled to the corresponding word line.

2. The flash memory according to claim 1, wherein the transistor comprises a floating gate and a control gate, the floating gate is configured as the charge storage structure, and the control gate is coupled to the word line and covers the floating gate.

3. The flash memory according to claim 1, wherein the transistor is a gate-all-around (GAA) transistor and has a silicon oxide-silicon nitride-silicon oxide structure as the charge storage structure.

4. The flash memory according to claim 1, wherein the rectifying device is a diode, an anode of the diode is the input end of the rectifying device, and a cathode of the diode is the output end of the rectifying device.

5. The flash memory according to claim 1, wherein the rectifying device is a selector formed by back-end of line.

6. The flash memory according to claim 1, further comprising:
a controller coupled to the flash memory cells,
wherein in a programming operation, the controller:
enables a selected word line corresponding to a selected memory cell to receive a first voltage, enables a selected bit line corresponding to the selected memory cell to receive a second voltage, and enables a selected source line corresponding to the selected memory cell to receive a third voltage, wherein the first voltage is greater than the second voltage, and the second voltage is greater than the third voltage.

7. The flash memory according to claim 6, wherein the controller enables the selected memory cell to perform the programming operation by channel hot electron injection or FN tunneling.

8. The flash memory according to claim 6, wherein a plurality of first flash memory cells among the flash memory cells are disposed in a same well area, and in an erasing operation, the controller provides an erasing voltage to the well area and performs a block erasing operation on the first flash memory cells.

9. The flash memory according to claim 8, wherein the controller performs the erasing operation by FN tunneling.

10. An operation method for a flash memory, comprising:
providing a rectifying device to be coupled between a corresponding bit line and a transistor having a charge storage structure; and
in a program operation, providing a controller to enable a selected word line corresponding to a selected memory cell to receive a first voltage, enable a selected bit line corresponding to the selected memory cell to receive a second voltage, and enable a selected source line corresponding to the selected memory cell to receive a third voltage,
wherein the first voltage is greater than the second voltage, and the second voltage is greater than the third voltage,
wherein the selected word line, the selected bit line and the selected source line are coupled to the selected memory cell.

11. The operation method according to claim 10, further comprising:
performing the programming operation by channel hot electron injection or FN tunneling.

12. The operation method according to claim 10, further comprising:
in an erasing operation, providing an erasing voltage to the well area and performs a block erasing operation on a plurality of first flash memory cells, wherein the first flash memory cells are disposed in a same well area.

13. The operation method according to claim 12, further comprising:
performing the erasing operation by FN tunneling.

* * * * *